(12) United States Patent
Ortiz et al.

(10) Patent No.: US 9,041,466 B2
(45) Date of Patent: May 26, 2015

(54) MULTIMODE DIFFERENTIAL AMPLIFIER BIASING SYSTEM

(71) Applicant: RF Micro Devices, Inc., Greensboro, NC (US)

(72) Inventors: Jeffery Peter Ortiz, Chandler, AZ (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 118 days.

(21) Appl. No.: 13/828,647

(22) Filed: Mar. 14, 2013

(65) Prior Publication Data

US 2014/0035673 A1    Feb. 6, 2014

Related U.S. Application Data

(60) Provisional application No. 61/679,293, filed on Aug. 3, 2012.

(51) Int. Cl.
*H03F 3/45*    (2006.01)
*H03F 1/02*    (2006.01)

(52) U.S. Cl.
CPC .......... *H03F 3/45076* (2013.01); *H03F 1/0261* (2013.01); *H03F 3/4508* (2013.01); *H03F 2203/45244* (2013.01); *H03F 2203/45294* (2013.01); *H03F 2203/45394* (2013.01); *H03F 2203/45481* (2013.01); *H03F 2203/45542* (2013.01); *H03F 2203/45621* (2013.01); *H03F 2203/45731* (2013.01)

(58) Field of Classification Search
USPC .......................................... 330/261, 252, 165
See application file for complete search history.

(56) References Cited

U.S. PATENT DOCUMENTS

| | | | | |
|---|---|---|---|---|
| 3,392,346 | A * | 7/1968 | Staubus | 330/69 |
| 4,247,825 | A * | 1/1981 | Berger | 330/261 |
| 4,287,478 | A * | 9/1981 | Berger | 330/256 |
| 7,081,796 | B2 * | 7/2006 | Krone | 330/254 |
| 2003/0020543 | A1 * | 1/2003 | Newton | 330/252 |
| 2010/0141339 | A1 * | 6/2010 | Day | 330/149 |

* cited by examiner

*Primary Examiner* — Henry Choe
(74) *Attorney, Agent, or Firm* — Withrow & Terranova, P.L.L.C.

(57) ABSTRACT

Differential power amplifier circuitry includes a differential transistor pair, an input transformer, and biasing circuitry. The base contact of each transistor in the differential transistor pair may be coupled to the input transformer through a coupling capacitor. The coupling capacitors may be designed to resonate with the input transformer about a desired frequency range, thereby passing desirable signals to the differential transistor pair while blocking undesirable signals. The biasing circuitry may include a pair of emitter follower transistors, each coupled at the emitter to the base contact of each one of the transistors in the differential transistor pair and adapted to bias the differential transistor pair to maximize efficiency and stability.

16 Claims, 6 Drawing Sheets

US 9,041,466 B2

MULTIMODE DIFFERENTIAL AMPLIFIER BIASING SYSTEM

RELATED APPLICATIONS

This application claims the benefit of U.S. provisional patent application No. 61/679,293, filed Aug. 3, 2012, the disclosure of which is hereby incorporated herein by reference in its entirety.

FIELD OF THE DISCLOSURE

The present disclosure relates to power amplifier circuitry, and specifically to differential power amplifiers for use in a mobile device.

BACKGROUND

Modern mobile devices continue to demand an increasing amount of operating time from a single battery charge. Accordingly, power management is a primary concern for many mobile device manufacturers. One major source of power consumption within a mobile device is the power amplifier used in the transmission of wireless signals. A well designed power amplifier may reduce the power requirements of the mobile device in which it is incorporated, thereby significantly extending the battery life of the mobile device.

FIG. 1 shows conventional single-ended power amplifier circuitry 10 for use in a mobile device. The conventional single-ended power amplifier circuitry 10 includes an amplifying transistor 12 including a collector contact 14, an emitter contact 16, and a base contact 18, biasing circuitry 20, an input capacitor 22, an output capacitor 24, and an output inductor 26. The base contact 18 of the amplifying transistor 12 is coupled to the biasing circuitry 20. The input capacitor 22 is coupled between the base contact 18 of the amplifying transistor 12 and an input terminal 28. The emitter contact 16 of the amplifying transistor 12 is coupled to ground. The collector contact 14 of the amplifying transistor 12 is coupled to a supply voltage VCC through the output inductor 26. The output capacitor 24 is coupled between an output terminal 30 and the collector contact 14 of the amplifying transistor 12.

The conventional single-ended power amplifier circuitry 10 is adapted to receive an input signal V_INPUT at the input terminal 28 and produce at the output terminal 30 an amplified output signal V_OUTPUT. Although the conventional single-ended power amplifier circuitry 10 effectively amplifies the input signal V_INPUT, the circuitry suffers from a relatively low efficiency when compared to alternative power amplifier architectures. Due to the limited output voltage of the conventional single-ended power amplifier circuitry 10, the output impedance of the conventional single-ended power amplifier circuitry 10 must be kept low, on the order of 2-3Ω for a power delivery of 2 W with a supply voltage VCC of 3.6 V and a saturation voltage of 100 mV. In order to match the low output impedance of the conventional single-ended power amplifier circuitry 10 with a load, the output capacitor 24 and the output inductor 26 are adapted to match the impedance of the load. Assuming a standard load impedance of 50Ω, the transformation ratio of the output capacitor 24 and the output inductor 26 should be around 16. Because of the relatively high transformation ratio required by the conventional single-ended power amplifier circuitry 10, the efficiency of the circuitry will suffer, thereby degrading the performance of a mobile device in which the conventional single-ended power amplifier circuitry 10 is incorporated.

One way to increase the efficiency of a power amplifier is to use a differential architecture. FIG. 2 shows conventional differential power amplifier circuitry 32 for use in a mobile device. The conventional differential power amplifier circuitry 32 includes a differential transistor pair 34 including a first transistor TR1 and a second transistor TR2, an input transformer 36, an output transformer 38, and biasing circuitry 40. The input transformer 36 includes a single-ended input terminal 42, a first differential output terminal 44, and a second differential output terminal 46. The input transformer 36 is adapted to receive a single-ended input at the single-ended input terminal 42, and produce a differential output signal at the first differential output terminal 44 and the second differential output terminal 46. The output transformer 38 includes a first differential input terminal 54, a second differential input terminal 56, and a single-ended output terminal 50. The output terminal is adapted to receive a differential input signal at a first differential input terminal 54 and a second differential input terminal 56, and produce a single-ended output signal at the single-ended output terminal 50.

The first transistor TR1 includes a collector contact 52, an emitter contact 58, and a base contact 60. The collector contact 52 of the first transistor TR1 is coupled to the first differential input terminal 54 of the output transformer 38. The emitter contact 58 of the first transistor TR1 is coupled to ground. The base contact 60 of the first transistor TR1 is coupled to the first differential output terminal 44 of the input transformer 36. The second transistor TR2 also includes a collector contact 62, an emitter contact 64, and a base contact 66. The collector contact 62 of the second transistor TR2 is coupled to the second differential input terminal 56 of the output transformer 38. The emitter contact 64 of the second transistor TR2 is coupled to ground. The base contact 66 of the second transistor TR2 is coupled to the second differential output terminal 46 of the input transformer 36. The biasing circuitry 40 is coupled at the midpoint of the differential output terminals 44 and 46 of the input transformer 36.

The conventional differential power amplifier circuitry 32 is adapted to receive an input signal V_INPUT at the single-ended input terminal 42 of the input transformer 36, and produce at the single-ended output terminal 50 of the output transformer 38 an amplified output signal V_OUTPUT. Due to the differential architecture of the conventional differential power amplifier circuitry 32, the amplified output signal V_OUTPUT is increased by a factor of two over the conventional single-ended power amplifier circuitry 10. Accordingly, the output impedance of the differential transistor pair 34 can be about four times higher than that of the conventional single-ended power amplifier circuitry 10 while maintaining substantially the same power output. As a result of the increased output impedance of the conventional differential power amplifier circuitry 32, the transformation ratio of the output transformer 38 is reduced by a factor of four, resulting in a higher efficiency than what is achievable by the conventional single-ended power amplifier circuitry 10 shown in FIG. 1.

Although the conventional differential power amplifier circuitry 32 is capable of efficiently producing an amplified output signal V_OUTPUT from an input signal V_INPUT, the conventional differential power amplifier circuitry 32 may suffer from instability due to the high gain characteristics of the differential transistor pair 34 at low frequencies. Accordingly, a power amplifier is needed that is both efficient and stable in order to increase the operating time of a mobile device in which it is incorporated.

SUMMARY

Differential power amplifier circuitry includes a differential transistor pair including a first transistor and a second transistor, an input transformer, and biasing circuitry. The input transformer includes a single-ended input terminal, a first differential output terminal, and a second differential output terminal. The first transistor includes a base contact coupled to the first differential output terminal of the input transformer through a first coupling capacitor, an emitter contact coupled to ground, and an output terminal. The second transistor includes a base contact coupled to the second differential output terminal of the input transformer through a second coupling capacitor, an emitter contact coupled to ground, and an output terminal. The biasing circuitry is coupled to the base contact of the first transistor and the second transistor. The first coupling capacitor and the second coupling capacitor are designed to resonate with the input transformer at a desired frequency range in order to pass a signal to the base terminals of the differential transistor pair for amplification, while blocking signals outside of the desired frequency range from reaching the differential transistor pair. Accordingly, instability of the differential power amplifier circuitry at undesirable frequency ranges is avoided.

According to one embodiment, the biasing circuitry includes a first biasing transistor and a second biasing transistor. The first biasing transistor is configured as an emitter-follower, and includes a base contact coupled to a fixed voltage source, a collector contact coupled to a supply voltage, and an emitter contact coupled to the base of the first transistor. The second biasing transistor is also configured as an emitter-follower, and includes a base contact coupled to a fixed voltage source, a collector contact coupled to a supply voltage, and an emitter contact coupled to the base of the second transistor. By using separate biasing circuitry for the first transistor and the second transistor, signal losses as a result of the biasing circuitry are minimized, thereby allowing the differential power amplifier circuitry to achieve higher gains with a greater level of efficiency.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
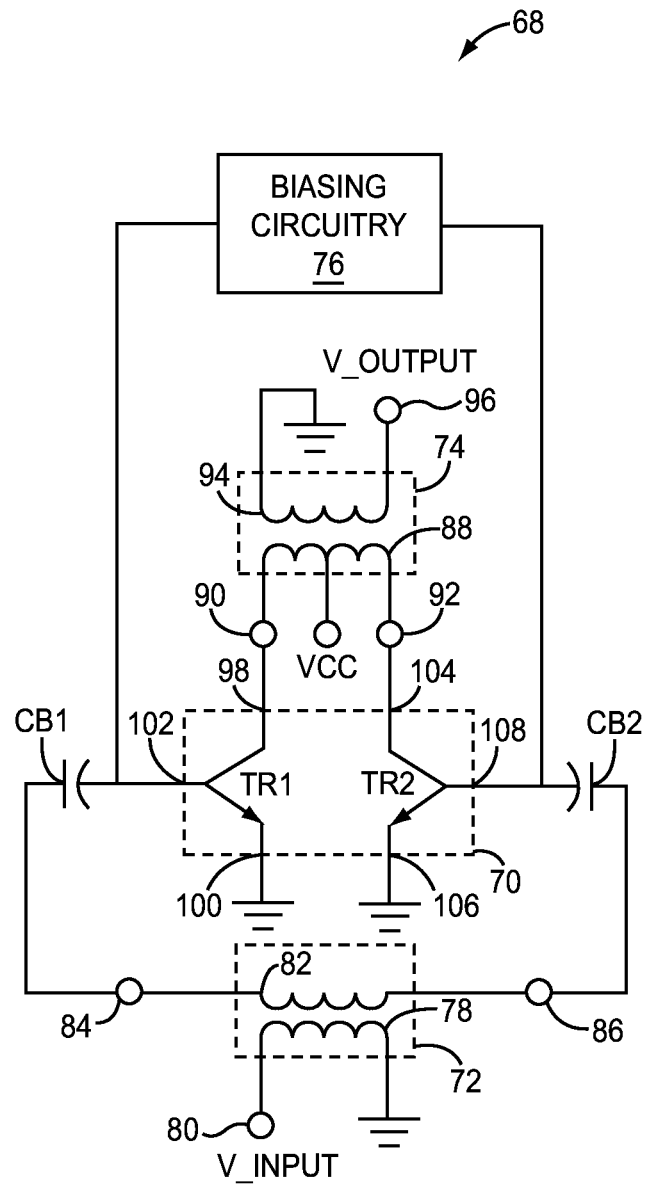
FIG. 3 shows a schematic representation of an embodiment of differential power amplifier circuitry according to the present disclosure.

Turning now to FIG. 3, a schematic representation of differential power amplifier circuitry 68 is shown according to one embodiment of the present disclosure. According to this embodiment, the differential power amplifier circuitry 68 includes a differential transistor pair 70 including a first transistor TR1 and a second transistor TR2, an input transformer 72, an output transformer 74, and biasing circuitry 76. The input transformer 72 includes a primary winding 78 coupled between ground and a single-ended input terminal 80 and a secondary winding 82 coupled between a first differential output terminal 84 and a second differential output terminal 86. The input transformer 72 is adapted to receive a single-ended input signal at the single-ended input terminal 80 and produce a differential output signal at the first differential output terminal 84 and the second differential output terminal 86. The output transformer 74 includes a primary winding 88 coupled between a first differential input terminal 90 and a second differential input terminal 92 and a secondary winding 94 coupled between a single-ended output terminal 96 and ground. The output transformer 74 is adapted to receive a differential input signal at the first differential input terminal 90 and the second differential input terminal 92 and produce a single-ended output signal at the single-ended output terminal 96. According to one embodiment, a supply voltage VCC is coupled at the midpoint of the primary winding 88 of the output transformer 74.

The first transistor TR1 includes a collector contact 98, an emitter contact 100, and a base contact 102. The collector contact 98 of the first transistor TR1 is coupled to the first differential input terminal 90 of the output transformer 74.

The emitter contact 100 of the first transistor TR1 is coupled to ground. The base contact 102 of the first transistor TR1 is coupled to the first differential output terminal 84 of the input transformer 72 through a first coupling capacitor CB1. The second transistor TR2 also includes a collector contact 104, an emitter contact 106, and a base contact 108. The collector contact 104 of the second transistor TR2 is coupled to the second differential input terminal 92 of the output transformer 74. The emitter contact 106 of the second transistor TR2 is coupled to ground. The base contact 108 of the second transistor TR2 is coupled to the second differential output terminal 86 of the input transformer 72 through a second coupling capacitor CB2.

The biasing circuitry is coupled to the base contact 102 of the first transistor TR1 and the base contact 108 of the second transistor TR2. The biasing circuitry is adapted to set the quiescent operating characteristics of the differential transistor pair 70, as will be discussed in further detail below.

The differential power amplifier circuitry 68 is adapted to receive an input signal V_INPUT at the single-ended input terminal 80 of the input transformer 72, and produce at the single-ended output terminal 96 of the output transformer 74 an amplified output signal V_OUTPUT. Due to the topology of the differential power amplifier circuitry 68, a high level of efficiency and stability can be achieved, thereby extending the battery life of a mobile device in which the differential power amplifier circuitry 68 is incorporated, as will be discussed in further detail below.

According to one embodiment, the first coupling capacitor CB1 and the second coupling capacitor CB2 are designed to resonate with the secondary winding 82 of the input transformer 72 about one or more passing frequency bands. When resonant with the secondary winding 82 of the input transformer 72, the first coupling capacitor CB1 and the second coupling capacitor CB2 form a substantially low impedance path between the secondary winding 82 of the input transformer 72 and the differential transistor pair 70. Accordingly, signals about the one or more passing frequency bands will be delivered to the differential transistor pair 70 for amplification. When not resonant with the secondary winding 82 of the input transformer 72, the first coupling capacitor CB1 and the second coupling capacitor CB2 form a substantially high impedance path between the secondary winding 82 of the input transformer 72 and the differential transistor pair 70. Accordingly, signals outside of the one or more passing frequency bands will be blocked from reaching the differential transistor pair 70, and will not be amplified. By designing the first coupling capacitor CB1 and the second coupling capacitor CB2 such that they are resonant with the secondary winding 82 of the input transformer 72 about one or more passing frequency bands, instability of the differential power amplifier circuitry 68 at undesirable frequency ranges can be avoided.

Figure 4:
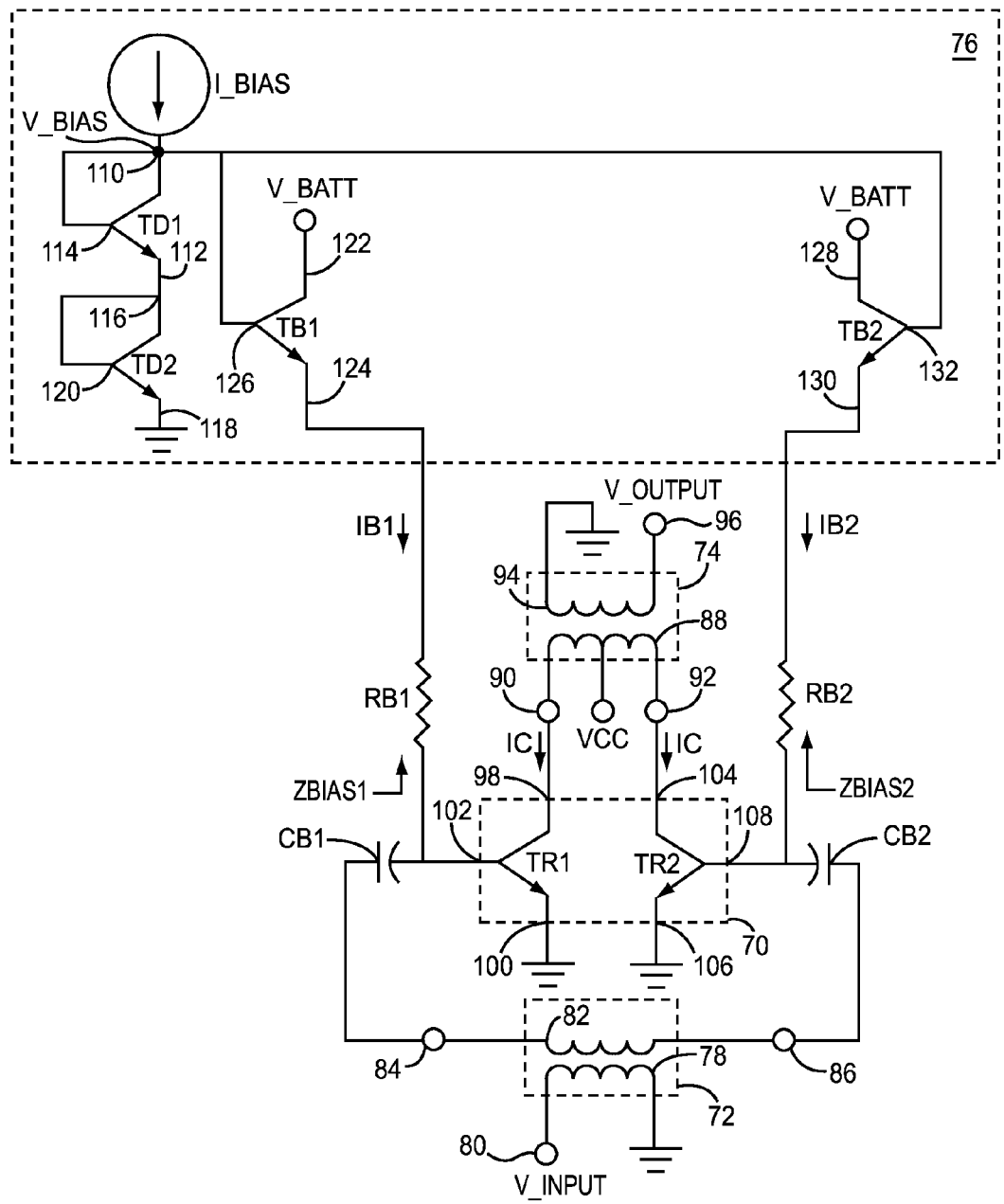
FIG. 4 shows a schematic representation of the differential power amplifier circuitry of FIG. 3 including further details of the biasing circuitry.

FIG. 4 shows the differential power amplifier circuitry 68 of FIG. 3 including further details of the biasing circuitry 76 according to one embodiment of the present disclosure. According to this embodiment, the biasing circuitry 76 includes a biasing current source I_BIAS, a first diode connected transistor TD1, a second diode connected transistor TD2, a first biasing transistor TB1, and a second biasing transistor TB2. The first diode connected transistor TD1 includes a collector contact 110, an emitter contact 112, and a base contact 114. The second diode connected transistor TD2 also includes a collector contact 116, an emitter contact 118, and a base contact 120. The emitter contact 118 of the second diode connected transistor TD2 is coupled to ground. The collector contact 116 of the second diode connected transistor TD2 is coupled to the emitter contact 112 of the first diode connected transistor TD1. The collector contact 110 of the first diode connected transistor TD1 is coupled to the biasing current source I_BIAS. The base contact 114 of the first diode connected transistor TD1 and the base contact 120 of the second diode connected transistor TD2 are coupled to the collector contact 110 of the first diode connected transistor TD1 and the collector contact 116 of the second diode connected transistor TD2, respectively. Accordingly, a first biasing voltage V_BIAS is generated across the first diode connected transistor TD1 and the second diode connected transistor TD2. According to one embodiment, the first diode connected transistor TD1 and the second diode connected transistor TD2 are diodes.

The first biasing transistor TB1 includes a collector contact 122, an emitter contact 124, and a base contact 126. The collector contact 122 of the first biasing transistor TB1 is coupled to a battery voltage V_BATT. The base contact 126 of the first biasing transistor TB1 is coupled between the collector contact 110 of the first diode connected transistor TD1 and the biasing current source I_BIAS such that the base contact 126 of the first biasing transistor TB1 receives the first biasing voltage V_BIAS. The emitter contact 124 of the first biasing transistor TB1 is coupled to the base contact 102 of the first transistor TR1 through a first biasing resistor RB1 in order to deliver a first biasing current IB1 to the base contact 102 of the first transistor TR1.

The second biasing transistor TB2 also includes a collector contact 128, an emitter contact 130, and a base contact 132. The collector contact 128 of the second biasing transistor TB2 is coupled to the battery voltage V_BATT. The base contact 132 of the second biasing transistor TB2 is coupled to the collector contact 110 of the first diode connected transistor TD1 and the biasing current source I_BIAS such that the base contact 132 of the second biasing transistor TB2 receives the first biasing voltage V_BIAS. The emitter contact 130 of the second biasing transistor TB2 is coupled to the base contact 108 of the second transistor TR2 through a second biasing resistor RB2 in order to deliver a second biasing current IB2 to the base contact 108 of the second transistor TR2.

In a quiescent state of operation, wherein no input signal V_INPUT is present, a DC collector current IC will flow in the collector contact of the first transistor TR1 and the second transistor TR2. The collector current IC is determined by the ratio of the respective areas of the first diode connected transistor TD1, the second diode connected transistor TD2, the first biasing transistor TB1, the second biasing transistor TB2, the first transistor TR1, and the second transistor TR2, as well as the biasing current source I_BIAS.

For input signals V_INPUT having a small amplitude, the operating conditions will remain substantially similar to those where no input signal V_INPUT is present. Further, the input impedance will be equal to the parallel combination of the base-emitter junction of the first transistor TR1 and the first biasing resistor RB1, or the base-emitter junction of the second transistor TR2 and the second biasing resistor RB2.

Figure 1:
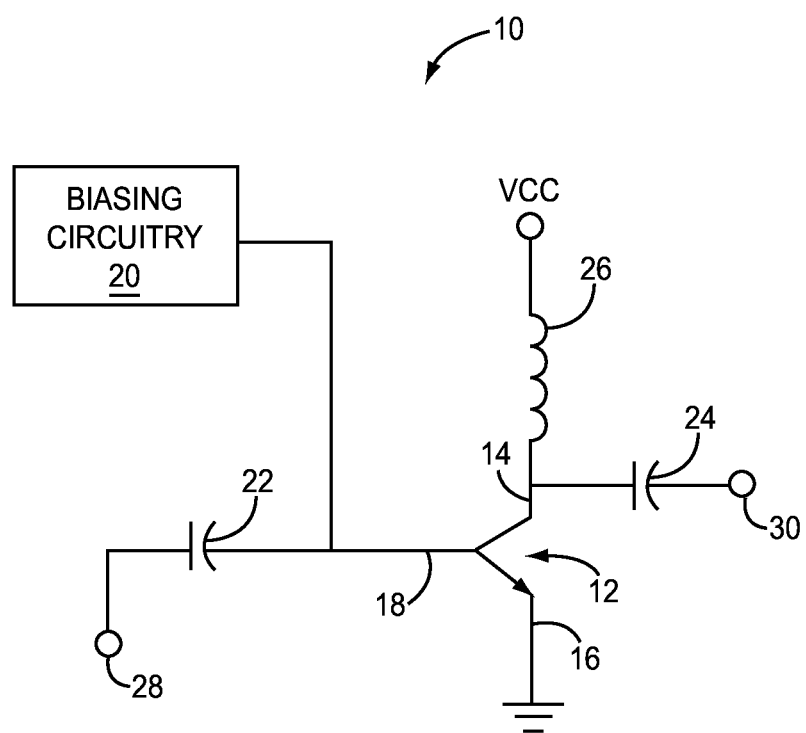
FIG. 1 shows a schematic representation of conventional single-ended power amplifier circuitry.
Figures 1, 5A:
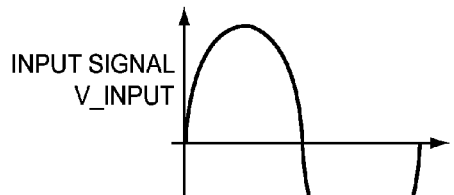
FIGS. 5A-5F show waveforms describing the voltage response at a plurality of locations in the differential power amplifier circuitry according to the present disclosure.
Figures 1, 5B:
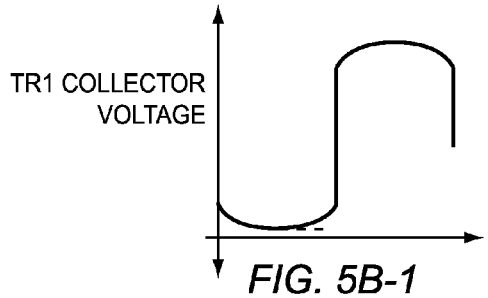
Figures 2, 5B:
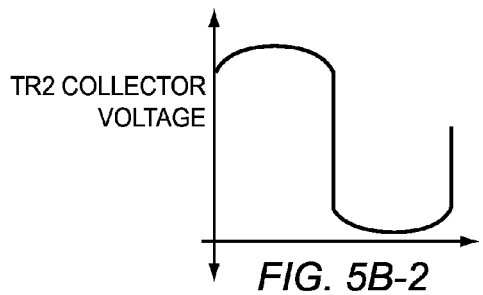
Figures 1, 5C:
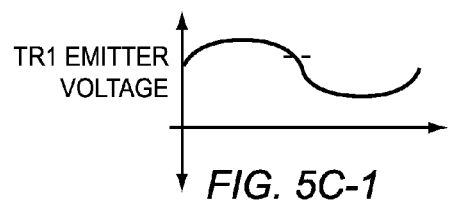
Figures 2, 5C:
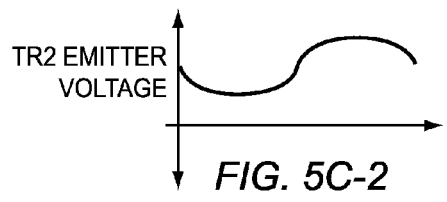
Figures 1, 5D:
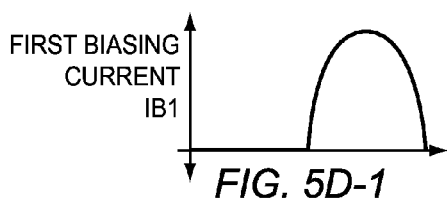
Figures 2, 5D:
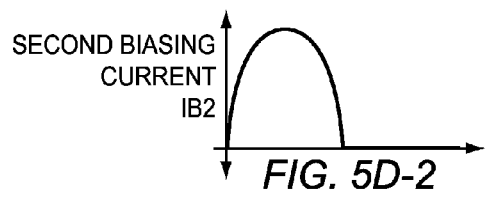
Figures 1, 5E:
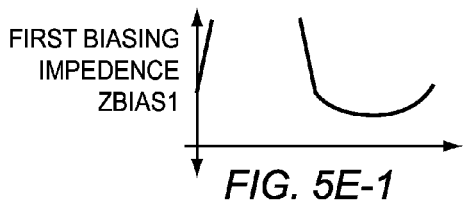
Figures 2, 5E:
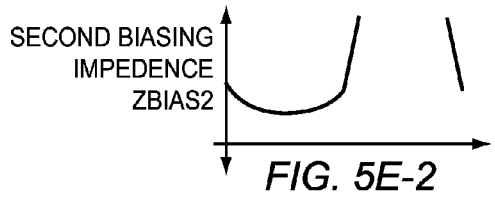

As the amplitude of the input signal V_INPUT increases, the differential power amplifier circuitry 68 will behave as indicated in FIGS. 5A-5F. The input signal V_INPUT presented to the single-ended input terminal 80 of the input transformer 72 is split into a differential signal. The non-inverted portion of the input signal V_INPUT is delivered through the first coupling capacitor CB1 to the base contact 102 of the first transistor TR1. The inverted portion of the input signal V_INPUT is delivered through the second coupling capacitor CB2 to the base contact 108 of the second transistor TR2. During the positive half cycle of the input signal V_INPUT shown in FIG. 5A, the non-inverted portion of the input signal V_INPUT causes the voltage at the base contact 102 of the first transistor TR1 to rise, thereby increasing the collector current IC1 of the first transistor TR1. This causes the voltage at the collector contact 98 of the first transistor TR1 to fall, as is shown in FIG. 5B-1. The increase in the voltage at the base contact 102 of the first transistor TR1 also causes an increase in the voltage at the emitter contact 124 of the first biasing transistor TB1, as is shown in FIG. 5C-1. This causes the first biasing transistor TB1 to turn off, thereby lowering the first biasing current IB1 to zero, as is shown in FIG. 5D-1. Additionally, this causes the first biasing transistor TB1 to present a substantially high impedance to the base contact 102 of the first transistor TR1, as is shown in FIG. 5E-1.

Figure 2:
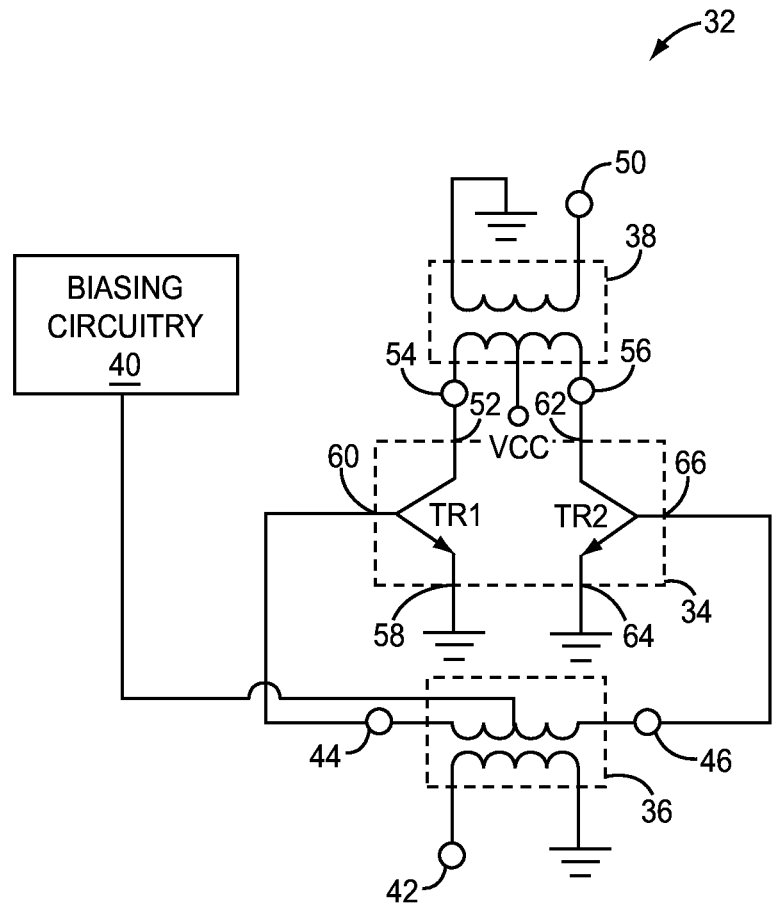
FIG. 2 shows a schematic representation of conventional differential power amplifier circuitry.

During the same positive half cycle of the input signal V_INPUT shown in FIG. 5A, the inverting portion of the input signal V_INPUT causes the voltage at the base contact 108 of the second transistor TR2 to fall, thereby turning off the second transistor TR2 and essentially lowering the collector current IC2 of the second transistor TR2 to zero. This causes the voltage at the collector contact 104 of the second transistor TR2 to rise, as shown in FIG. 5B-2. The decrease in the voltage at the base contact 108 of the second transistor TR2 also causes a decrease in the voltage at the emitter contact 130 of the second biasing transistor TB2, as shown in FIG. 5C-2. This causes the second biasing transistor TB2 to pass more current, thereby increasing the second biasing current IB2, as shown in FIG. 5D-2. Additionally, this causes the second biasing transistor TB2 to present a substantially low impedance to the base contact 108 of the second transistor TR2, as is shown in FIG. 5E-2. Because the second transistor TR2 is in an off state, the current flows into and charges the second coupling capacitor CB2.

Figure 5F:
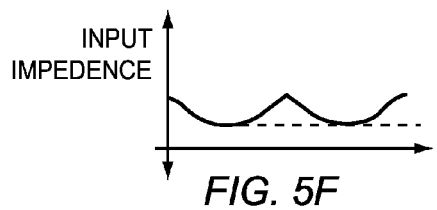

During the negative half cycle of the input signal V_INPUT shown in FIG. 5A, the first transistor TR1 will behave in a substantially similar manner to the second transistor TR2, and vice versa. FIG. 5F shows the input impedance of the differential power amplifier circuitry 68 during both the positive and negative half cycle of the input signal V_INPUT. As is shown, the input impedance of the differential power amplifier circuitry 68 at high drive levels is about equal to the base-emitter impedance of the first transistor TR1 and the second transistor TR2. This is greater than the input impedance seen at low drive levels of the input signal V_INPUT, where the input impedance is equal to the base-emitter impedance of the first transistor TR1 in parallel with the first biasing resistor RB1 and the base-emitter impedance of the second transistor TR2 in parallel with the biasing resistor RB2. Thus, it is shown that the input impedance increases with the drive level of the input signal V_INPUT. The relationship of the input impedance to the drive level of the input signal V_INPUT minimizes the effect of net gain decreases as the drive level increases (due to effects such as compression, where the output voltage becomes limited by the supply voltage VCC). Accordingly, the differential power amplifier circuitry 68 may operate at higher power levels without losing linearity. Further, the biasing current requirements of the circuitry may be reduced while maintaining the same linearity at a given maximum output power level, thereby saving power in a mobile device in which the differential power amplifier circuitry 68 is incorporated.

Figure 6:
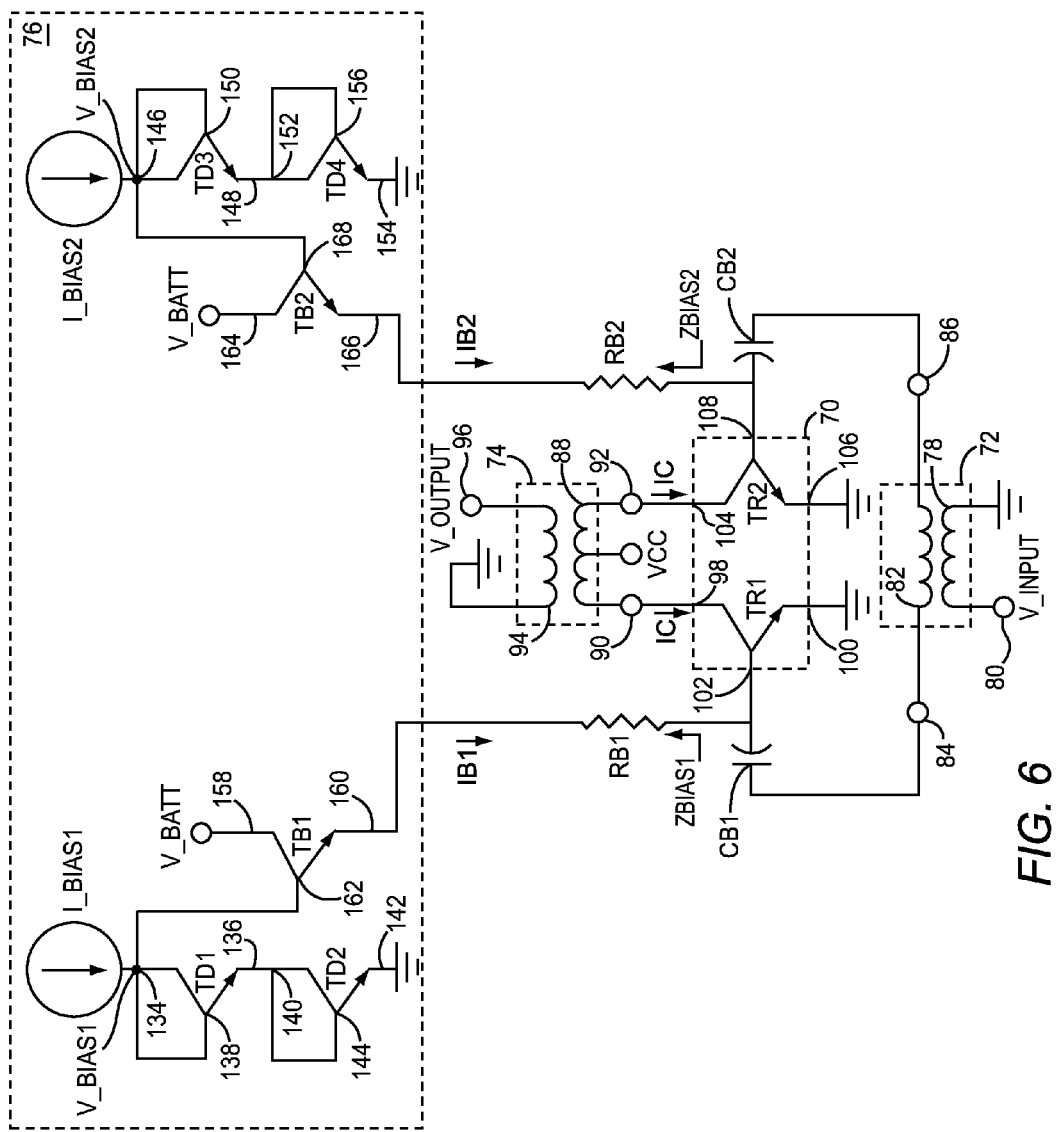
FIG. 6 shows a schematic representation of an additional embodiment of differential power amplifier circuitry according to the present disclosure.

FIG. 6 shows the differential power amplifier circuitry 68 of FIG. 3 including further details of the biasing circuitry 76 according to one embodiment of the present disclosure. According to this embodiment, the biasing circuitry 76 includes a first biasing current source I_BIAS1, a second biasing current source I_BIAS2, a first diode connected transistor TD1, a second diode connected transistor TD2, a third diode connected transistor TD3, a fourth diode connected transistor TD4, a first biasing transistor TB1, and a second biasing transistor TB2. The first diode connected transistor TD1 includes a collector contact 134, an emitter contact 136, and a base contact 138. The second diode connected transistor TD2 also includes a collector contact 140, and emitter contact 142, and a base contact 144. The emitter contact 142 of the second diode connected transistor TD2 is coupled to ground. The collector contact 140 of the second diode connected transistor TD2 is coupled to the emitter contact 136 of the first diode connected transistor TD1. The collector contact 134 of the first diode connected transistor TD1 is coupled to the first biasing current source I_BIAS1. The base contact 138 of the first diode connected transistor TD1 and the base contact 144 of the second diode connected transistor TD2 are coupled to the collector contact 134 of the first diode connected transistor TD1 and the collector contact 140 of the second diode connected transistor TD2, respectively. Accordingly, a first biasing voltage V_BIAS1 is generated across the first diode connected transistor TD1 and the second diode connected transistor TD2.

Similarly, the third diode connected transistor TD3 includes a collector contact 146, an emitter contact 148, and a base contact 150. The fourth diode connected transistor TD4 also includes a collector contact 152, an emitter contact 154, and a base contact 156. The emitter contact 154 of the fourth diode connected transistor TD4 is coupled to ground. The collector contact 152 of the fourth diode connected transistor TD4 is coupled to the emitter contact 148 of the third diode connected transistor TD3. The collector contact 146 of the third diode connected transistor TD3 is coupled to the second biasing current source I_BIAS2. The base contact 150 of the third diode connected transistor TD3 and the base contact 156 of the fourth diode connected transistor TD4 are coupled to the collector contact 146 of the third diode connected transistor TD3 and the collector contact 152 of the fourth diode connected transistor TD4, respectively. Accordingly, a second biasing voltage V_BIAS2 is generated across the third diode connected transistor TD3 and the fourth diode connected transistor TD4.

The first biasing transistor TB1 includes a collector contact 158, an emitter contact 160, and a base contact 162. The collector contact 158 of the first biasing transistor TB1 is coupled to a battery voltage V_BATT. The base contact 162 of the first biasing transistor TB1 is coupled between the collector contact 134 of the first diode connected transistor TD1 and the first biasing current source I_BIAS1 such that the base contact 162 of the first biasing transistor TB1 receives the first biasing voltage V_BIAS1. The emitter contact 160 of the first biasing transistor TB1 is coupled to the base contact 102 of the first transistor TR1 through a first biasing resistor RB1 in order to deliver a first biasing current IB1 to the first transistor TR1.

The second biasing transistor TB2 includes a collector contact 164, an emitter contact 166, and a base contact 168. The collector contact 164 of the second biasing transistor TB2 is coupled to a battery voltage V_BATT. The base contact 168 of the second biasing transistor TB2 is coupled between the collector contact 146 of the third diode connected transistor TD3 and the second biasing current source I_BIAS2 such that the base contact 168 of the second biasing transistor TB2 receives the second biasing voltage V_BIAS2. The emitter contact 166 of the second biasing transistor TB2 is coupled to the base contact 108 of the second transistor TR2 through a second biasing resistor RB2 in order to deliver a second biasing current IB2 to the second transistor TR2.

In a quiescent state of operation, wherein no input signal V_INPUT is present, a DC collector current IC will flow in the collector contact of the first transistor TR1 and the second transistor TR2. The collector current IC is determined by the ratio of the respective areas of the first diode connected transistor TD1, the second diode connected transistor TD2, the third diode connected transistor TD3, the fourth diode connected transistor TD4, the first biasing transistor TB1, the second biasing transistor TB2, the first transistor TR1, and the second transistor TR2, as well as the first biasing current source I_BIAS1 and the second biasing current source I_BIAS2. For input signals V_INPUT having a small amplitude, these conditions will remain substantially similar.

As the amplitude of the input signal V_INPUT increases, the differential power amplifier circuitry 68 will behave as indicated in FIGS. 5A-5F, as described above. Once again, due to the input impedance characteristics of the differential power amplifier circuitry 68, the effects of net gain decreases as the drive level of the input signal V_INPUT increases (due to effects such as compression, where the output voltage becomes limited by the supply voltage VCC) are reduced. Accordingly, the differential power amplifier circuitry 68 may operate at higher power levels without losing linearity. Further, the biasing current requirements of the circuitry may be reduced while maintaining the same linearity at a given maximum output power level, thereby saving power in a mobile device in which the differential power amplifier circuitry 68 is incorporated.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
    a differential power amplifier including a first differential input terminal, a second differential input terminal, a first differential output terminal, and a second differential output terminal;
    an input transformer including a first winding coupled between a single-ended input terminal and ground and a second winding coupled between a first transforming output terminal and a second transforming output terminal;
    a first coupling capacitor coupled between the first transforming output terminal and the first differential input terminal; and
    a second coupling capacitor coupled between the second transforming output terminal and the second differential input terminal, wherein the first coupling capacitor and the second coupling capacitor are configured to resonate with the second winding of the input transformer about a predetermined frequency range in order to pass signals about the predetermined frequency range to the differential power amplifier and attenuate signals outside of the predetermined frequency range.

2. The circuitry of claim 1 wherein the predetermined frequency range is selected to optimize the stability of the differential power amplifier.

3. The circuitry of claim 1 wherein the input transformer is adapted to accept a single-ended input signal at the single-ended input terminal and deliver a differential output signal to the first transforming output terminal and the second transforming output terminal.

4. The circuitry of claim 1 further comprising an output transformer including a first winding coupled between a first transforming input terminal and a second transforming input terminal and a second winding coupled between a single-ended output terminal and ground.

5. The circuitry of claim 4 wherein the output transformer is adapted to receive a differential input signal from the first transforming input terminal and the second transforming input terminal and deliver a single-ended output signal to the single-ended output terminal.

6. The circuitry of claim 1 further comprising biasing circuitry coupled to the first differential input terminal and the second differential input terminal.

7. The circuitry of claim 6 wherein the biasing circuitry comprises:
    a first biasing transistor including:
        a collector contact coupled to a supply voltage;
        a base contact coupled to a biasing voltage source; and
        an emitter contact coupled to the first differential input terminal; and
    a second biasing transistor including:
        a collector contact coupled to the supply voltage;
        a base contact coupled to the biasing voltage source; and
        an emitter contact coupled to the second differential input terminal.

8. The circuitry of claim 7 wherein the emitter contact of the first biasing transistor is coupled to the first differential input terminal through a first biasing resistor, and the emitter contact of the second biasing transistor is coupled to the second differential input terminal through a second biasing resistor.

9. The circuitry of claim 7 wherein the biasing voltage source includes:
    a biasing current source coupled to a biasing output terminal;
    a first diode connected transistor including:
        a collector contact coupled to the biasing output terminal;
        a base contact coupled to the collector contact; and
        an emitter contact; and
    a second diode connected transistor including:
        a collector contact coupled to the emitter contact of the first diode connected transistor;
        a base contact coupled to the collector contact; and
        an emitter contact coupled to ground.

10. The circuitry of claim 7 wherein the biasing voltage source includes:
    a biasing current source coupled to a biasing output terminal;
    a first diode including an anode coupled to the biasing output terminal and a cathode; and
    a second diode including an anode coupled to the cathode of the first diode and a cathode coupled to ground.

11. The circuitry of claim 6 wherein the biasing circuitry comprises:
    a first biasing transistor including:
        a collector contact coupled to a supply voltage;
        a base contact coupled to a first biasing voltage source; and
        an emitter contact coupled to the first differential input terminal; and
    a second biasing transistor including:
        a collector contact coupled to the supply voltage;
        a base contact coupled to a second biasing voltage source; and
        an emitter contact coupled to the second differential input terminal.

12. The circuitry of claim 11 wherein the emitter contact of the first biasing transistor is coupled to the first differential input terminal through a first biasing resistor, and the emitter contact of the second biasing transistor is coupled to the second differential input terminal through a second biasing resistor.

13. The circuitry of claim 11 wherein the first biasing voltage source includes:
   a first biasing current source coupled to a first biasing output terminal;
   a first diode connected transistor including:
      a collector contact coupled to the first biasing output terminal;
      a base contact coupled to the collector contact; and
      an emitter contact; and
   a second diode connected transistor including:
      a collector contact coupled to the emitter contact of the first diode connected transistor;
      a base contact coupled to the collector contact; and
      an emitter contact coupled to ground.

14. The circuitry of claim 13 wherein the second biasing voltage source includes:
   a second biasing current source coupled to a second biasing output terminal;
   a third diode connected transistor including:
      a collector contact coupled to the second biasing output terminal;
      a base contact coupled to the collector contact; and
      an emitter contact; and
   a fourth diode connected transistor including:
      a collector contact coupled to the emitter contact of the third diode connected transistor;
      a base contact coupled to the collector contact; and
      an emitter contact coupled to ground.

15. The circuitry of claim 11 wherein the first biasing voltage source includes:
   a first biasing current source coupled to a first biasing output terminal;
   a first diode including an anode coupled to the first biasing output terminal and a cathode; and
   a second diode including an anode coupled to the cathode of the first diode and a cathode coupled to ground.

16. The circuitry of claim 15 wherein the second biasing voltage source includes:
   a second biasing current source coupled to a second biasing output terminal;
   a first diode including an anode coupled to the second biasing output terminal and a cathode; and
   a second diode including an anode coupled to the cathode of the first diode and a cathode coupled to ground.

* * * * *